(12) United States Patent
Xiao et al.

(10) Patent No.: US 10,963,111 B1
(45) Date of Patent: Mar. 30, 2021

(54) TOUCH SUBSTRATE AND METHOD FOR PREPARING THE SAME, AND TOUCH DEVICE

(71) Applicants: Chengdu BOE Optoelectronics Technology Co., Ltd., Chengdu (CN); BOE TECHNOLOGY GROUP CO., LTD., Beijing (CN)

(72) Inventors: Wenli Xiao, Beijing (CN); Jianjun Wu, Beijing (CN); Jiangsheng Wang, Beijing (CN); Chang Zhang, Beijing (CN)

(73) Assignees: CHENGDU BOE OPTOELECTRONICS TECHNOLOGY CO., LTD., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/830,537

(22) Filed: Mar. 26, 2020

(30) Foreign Application Priority Data

Nov. 6, 2019 (CN) .......................... 201911077109.4

(51) Int. Cl.
*G06F 3/044* (2006.01)
*H01L 27/32* (2006.01)

(52) U.S. Cl.
CPC .. *G06F 3/0443* (2019.05); *G06F 2203/04103* (2013.01); *G06F 2203/04111* (2013.01); *H01L 27/323* (2013.01)

(58) Field of Classification Search
CPC ......... G06F 3/0443; G06F 2203/04103; G06F 2203/04111; H01L 27/323
See application file for complete search history.

(56) References Cited

U.S. PATENT DOCUMENTS 10,168,844 B2 * 1/2019 Kwon .................... G06F 3/0446
10,761,664 B2 * 9/2020 Kwon ................. H01L 51/5256
(Continued)

FOREIGN PATENT DOCUMENTS

CN 205281453 U * 6/2016 ....... G02F 1/134336
EP 3109742 A1 * 12/2016 ......... H01L 51/5284
(Continued)

*Primary Examiner* — Michael Pervan
(74) *Attorney, Agent, or Firm* — Westman, Champlin & Koehler, P.A.

(57) ABSTRACT

A touch substrate and a method for preparing the same, as well as a touch device are provided in embodiments of the disclosure, the touch substrate includes a substrate, the substrate having a touch area on a first surface thereof and a first peripheral area surrounding the touch area, the touch area including a plurality of first electrodes and a plurality of second electrodes arranged in a same layer and provided alternately to cross each other, and the first peripheral area including a plurality of first signal lines connected with the plurality of first electrodes, and a plurality of second signal lines connected with the plurality of second electrodes; and the touch substrate further includes an isolation layer provided on a second surface of the substrate, with an orthogonal projection of the isolation layer on the substrate covering orthogonal projections of the plurality of first signal lines and the plurality of second signal lines on the substrate, and the second substrate being opposite to the first substrate.

15 Claims, 9 Drawing Sheets

(56) References Cited

U.S. PATENT DOCUMENTS

| | | | | |
|---|---|---|---|---|
| 2011/0316803 A1* | 12/2011 | Kim | ............... | G06F 3/0446 |
| | | | | 345/173 |
| 2016/0378224 A1* | 12/2016 | Kwon | ............ | H01L 27/3279 |
| | | | | 345/174 |
| 2019/0129541 A1* | 5/2019 | Kwon | ............ | G06F 3/0445 |

FOREIGN PATENT DOCUMENTS

| | | | | |
|---|---|---|---|---|
| JP | 6032794 B2 * | 11/2016 | ....... | G02F 1/134336 |
| KR | 20170088474 A * | 8/2017 | | |

\* cited by examiner

TOUCH SUBSTRATE AND METHOD FOR PREPARING THE SAME, AND TOUCH DEVICE

CROSS-REFERENCE TO RELATED APPLICATION

The present disclosure claims the benefit of Chinese Patent Application Disclosure No. 201911077109.4 filed on Nov. 6, 2019 in the State Intellectual Property Office of China, the whole disclosure of which is incorporated herein by reference.

BACKGROUND

Field

Embodiments of the present disclosure generally relate to the technical field of touch control technology, and in particular, to a touch substrate and a method for preparing the same, as well as a touch device.

Description of the Related Art

Touch control technology is a technology of implementing operation by touch control. With a rapid development of display technology, touch control technology has been applied to various electronic apparatus and various fields, and has become more and more popular with the majority of users. Depending on operational principles, the touch screen may for example comprise following types: capacitance type, resistance type, infrared type, surface acoustic type, electromagnetic type, vibration-wave induction type, and FTIR (i.e., Frustrated Total Internal Reflection) optical sensing type, and the like.

According to research of the inventor, in order to reduce impedances of signal lines/wirings of a touch screen, the signal lines/wirings of the touch screen may typically be routed in a way of gradual change. However, with an increase in a width of routed wirings, a parasitic capacitance between the signal lines of the touch screen and a cathode layer of a display panel (to which the touch screen is bonded) increases therewith, and then a ground capacitance of the signal lines/wirings of the touch screen may increase, and properties of both report rate and signal-to-noise ratio (SNR) of the touch screen are also decreased.

SUMMARY

The embodiments of the present disclosure have been made to overcome or alleviate at least one aspect of the above mentioned disadvantages and/or shortcomings in the prior art, by providing a touch substrate and a method for preparing the same, as well as a touch device, which can reduce the ground capacitance of the signal line of the touch screen.

Following technical solutions are adopted in exemplary embodiments of the disclosure. According to a first aspect of embodiments of the disclosure, there is provided a touch substrate, comprising a substrate, the substrate having a touch area on a first surface thereof and a first peripheral area surrounding the touch area, the touch area comprising a plurality of first electrodes and a plurality of second electrodes arranged in a same layer and provided alternately to cross each other, and the first peripheral area comprising a plurality of first signal lines connected with the plurality of first electrodes, and a plurality of second signal lines connected with the plurality of second electrodes; and the touch substrate further comprises an isolation layer provided on a second surface of the substrate, with an orthogonal projection of the isolation layer on the substrate covering orthogonal projections of the plurality of first signal lines and the plurality of second signal lines on the substrate, and the second substrate being opposite to the first substrate.

In exemplary embodiments, the first peripheral area further comprises a first protection line surrounding the plurality of first signal lines and the plurality of second signal lines; and the orthogonal projection of the isolation layer on the substrate covers an orthogonal projection of the first protection line on the substrate.

In exemplary embodiments, the substrate is provided with a plurality of through-holes, and the first protection line is connected with the isolation layer by passing through the plurality of through-holes.

In exemplary embodiments, the touch substrate also comprises a flexible printed circuit, the flexible printed circuit comprises a second protection line arranged to at least partially surround a wiring area, in which wirings are routed, on the flexible printed circuit, and to connect with the isolation layer.

In exemplary embodiments, the isolation layer comprises an isolation line arranged along the second surface of the substrate, the isolation line is provided with two terminals which are respectively grounded or connected to a synchronous signal source, and the synchronous signal source and a touch self-capacitive scanning signal of the touch substrate are set to be synchronous with each other and to have a same waveform.

In exemplary embodiments, the isolation layer comprises two isolation sub-lines mutually disconnected from each other or one another, each of which is grounded or connected to a synchronous signal source, and the synchronous signal source and a touch self-capacitive scanning signal of the touch substrate are set to be synchronized with each other and have a same waveform.

In exemplary embodiments, each isolation sub-line is grounded or connected to the synchronous signal source through an electrostatic protection device.

In exemplary embodiments, the electrostatic protection device is a transient suppression diode or an electrostatic protection diode.

In exemplary embodiments, the isolation layer is formed by a metal or a transparent conductive material.

According to a second aspect of the embodiment of the present disclosure, there is also provided a touch device, comprising the touch substrate as described above.

According to the third aspect of the embodiment of the present disclosure, there is further provided a method for preparing a touch substrate, comprising:

providing a substrate, the substrate comprising a first surface and a second surface opposite to the first surface;

forming both a touch area on the first surface and a first peripheral area surrounding the touch area, the touch area comprising a plurality of first electrodes and a plurality of second electrodes arranged in a same layer and provided alternately to cross each other, and the first peripheral area comprising a plurality of first signal lines connected with the plurality of first electrodes, and a plurality of second signal lines connected with the plurality of second electrodes; and forming an isolation layer on the second surface, with an orthogonal projection of the isolation layer on the substrate covering orthogonal projections of the plurality of first signal lines and the plurality of second signal lines on the substrate.

In exemplary embodiments, forming both a touch area on the first surface and a first peripheral area surrounding the touch area comprises:

forming a plurality of through-holes passing through the substrate;

forming a touch area on the first surface of the substrate through which a plurality of through-holes are formed, and a first peripheral area surrounding the touch area, to establish a connection between the first protection line and the isolation layer via the plurality of through-holes.

In exemplary embodiments, the method further comprises:

filling the plurality of through-holes with metal material by an electroplating process, to establish an electrical connection between the isolation layer and the first protection line.

In exemplary embodiments, the method further comprises: forming a flexible printed circuit comprising a second protection line arranged to at least partially surround a wiring area, in which wirings are routed, on the flexible printed circuit, and to connect with the isolation layer.

In exemplary embodiments, forming an isolation layer on the second surface comprises:

forming an isolation layer on the second surface of the substrate by a printing process or a patterning process.

BRIEF DESCRIPTION OF THE DRAWINGS

In order to more clearly illustrate technical solutions of the embodiments of the present disclosure, the drawings required to be used with the description of the embodiments of the present disclosure will be briefly described below. It is apparent that the drawings in the following description are merely some embodiments of the present disclosure. For those skilled in the art, other drawings can be obtained according to these drawings without paying any creative efforts. The above and/or additional aspects and advantages of the present application will become apparent and easy to understand from the following description of embodiments in combination with the drawings, wherein.

DETAILED DESCRIPTION

In order to make the object, technical solution and advantages of the disclosure clearer, a detailed description of the embodiments of the disclosure will be described in detail hereinafter, in combination with the accompanying drawings. It should be noted that, the embodiments in the present disclosure and the features in the embodiments can be arbitrarily combined with each other, without any conflict.

Unless otherwise defined, the technical terms or scientific terms disclosed in the embodiments of the disclosure shall be the general meaning understood by those skilled in the field of the disclosure. As used in the embodiment of the disclosure, "first", "second" and similar words are merely used to distinguish different components, rather than indicating any order, quantity or importance. And as to words "comprising" or "containing", or the like, elements or items appearing before such words may cover elements or items or equivalents thereof appearing after such words, without excluding other elements or items. Embodiments of the present disclosure will be described in more detail below with respect to the accompanying drawings. Throughout the drawings, same elements are denoted by like reference numerals. For the sake of clarity, various parts in the figures are not drawn to scale. Moreover, some well-known parts may not be shown in the figures.

Many specific details of the embodiments of the present disclosure, such as respective structure, material, size, processing technology of the components, are described below to provide a more thorough and clearer understanding of the embodiments of the present disclosure. It may easily occur to those skilled in the art that, embodiments of the present disclosure may be implemented without these specific details.

Respective dimension and shape of each component in the drawings are only intended to exemplarily illustrate the contents of the disclosure, rather than to demonstrate the practical dimension or proportion of components of a touch substrate and a touch device according to an embodiment of the disclosure.

Figure 1:
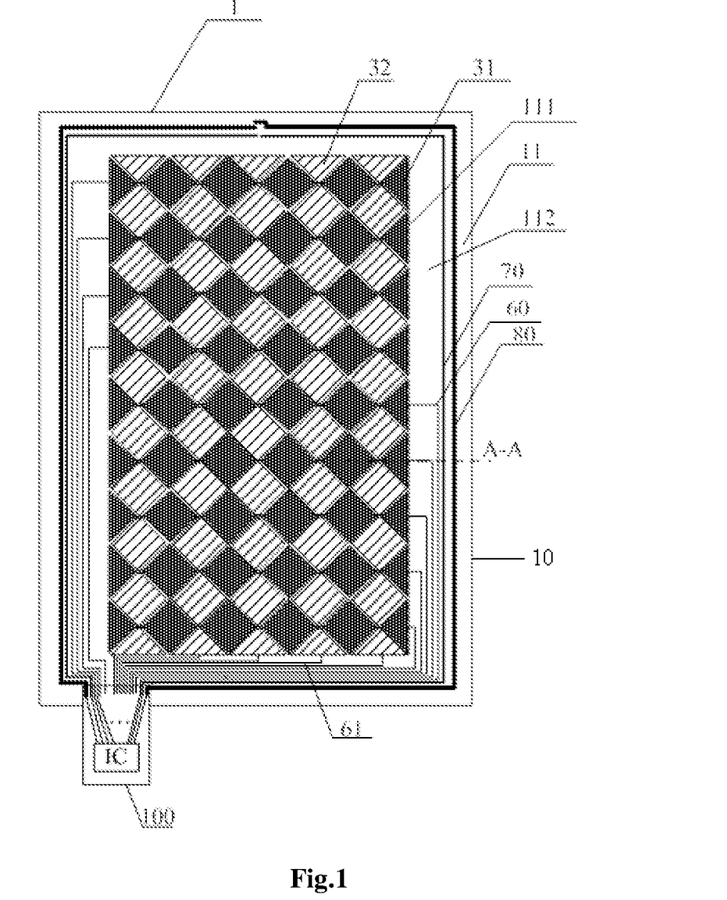
FIG. 1 is a structural schematic view of a first surface of an exemplary touch substrate according to a first embodiment of the disclosure.
Figure 2:
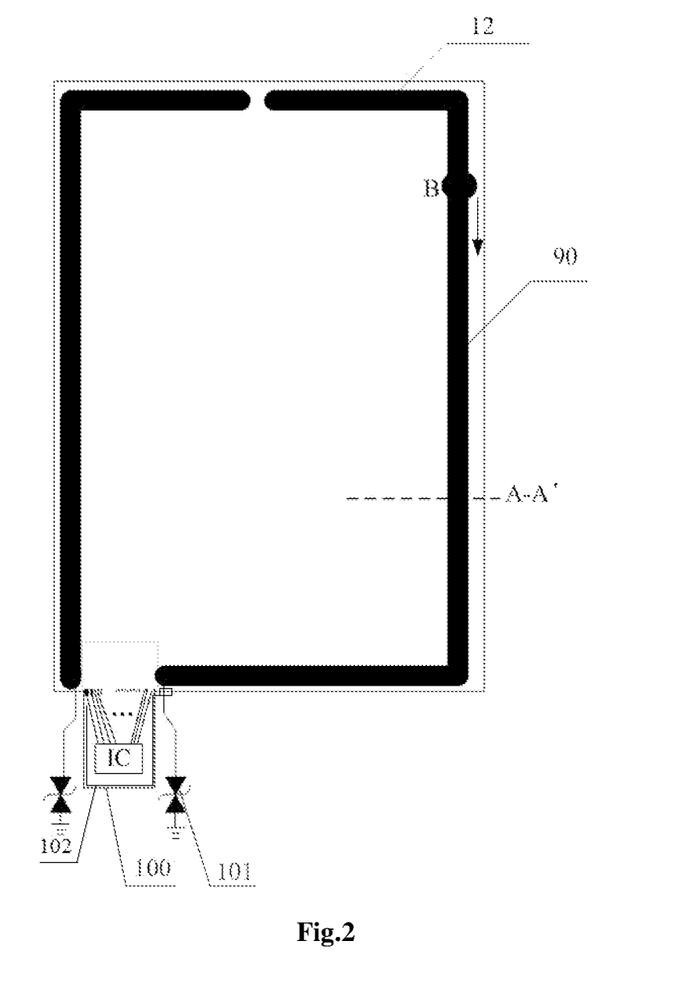
FIG. 2 is a structural schematic view of a second surface of an exemplary touch substrate according to the first embodiment of the disclosure.

Some embodiments According to a general technical concept of embodiments of the disclosure, in one aspect of the embodiment of the disclosure, as illustrated in FIG. 1 and FIG. 2, there is provided a touch substrate 1, which comprises: a substrate 10, having both a touch area 111 on a first surface 11 of the substrate 10 and a first peripheral area 112 surrounding the touch area 111; the touch area 111 comprises a plurality of first electrodes 31 and a plurality of second electrodes 32; and the first peripheral area 112 comprises a first signal line 60 connected with the first electrode 31 and a second signal line 61 connected with the second electrode 32.

More specifically, for example, an electrode pattern of the touch electrode layer 30 comprises the plurality of first electrodes 31 and the plurality of second electrodes 32 that are arranged alternately to cross each other, and spaced apart from each other. For example, each type of the plurality of first electrodes 31 and the plurality of second electrodes 32 comprises a plurality of diamond block electrodes (i.e., a plurality of electrodes each in the form of diamond block shape) arranged in an array as illustrated in the drawings. More specifically, in one type of the plurality of first electrodes 31 and the plurality of second electrodes 32, diamond block electrodes in each row thereof are connected with one another, but various rows thereof are disconnected from one another; while in another type of the plurality of first electrodes 31 and the plurality of second electrodes 32, individual diamond block electrodes thereof are spaced apart from one another; for example, as illustrated in FIG. 1, as to the plurality of first electrodes 31, first electrodes, each of which is in the form of diamond block shape, in each row thereof are connected with one another, but various rows thereof are disconnected from one another; while as to the plurality of second electrodes 32, second electrodes, each of which is in the form of diamond block shape, are individually spaced apart from one another. And for example as illustrated in FIG. 3, the touch substrate 1 for example further comprises a bridging layer 50 located above a layer in which the plurality of first electrodes 31 and the plurality of second electrodes 32 are located, and the bridging layer 50 is configured to establish a bridge connection among second electrodes, each of which is in the form of diamond block shape, in each line (e.g., each column or each row) of the type of electrodes in which individual diamond block electrodes thereof are spaced apart from one another.

The touch substrate 1 further comprises an isolation layer 90 provided on a second surface 12 of the substrate 10, with an orthogonal projection of the isolation layer 90 on the substrate 10 covering orthogonal projections of the plurality of first signal lines 60 and the plurality of second signal lines 61 on the substrate, and the second substrate 12 being opposite to the first substrate 11.

Figure 3:
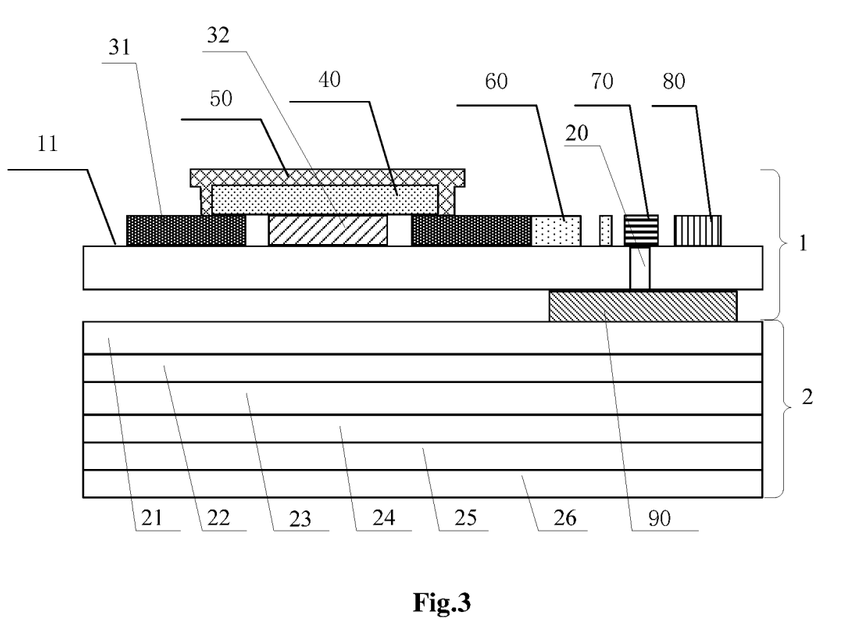
FIG. 3 is a sectional view of a section A-A' of a touch display panel according to the first embodiment of the disclosure.

FIG. 3 is a sectional view of a section A-A' of a touch display panel according to the first embodiment of the disclosure. Specifically, as illustrated in FIG. 3, the touch display panel comprises a touch substrate 1 and a display panel 2 which are overlapped with but spaced apart from each other, and the first surface 11 of the touch substrate 1 is a surface of the touch substrate 1 facing away from the display panel 2, and the second surface 12 of the touch substrate 1 is a surface of the touch substrate 1 facing towards the display panel 2. The display panel 2 comprises a package layer 21, a cathode layer 22, an organic light-emitting layer 23, an anode layer 24, a pixel definition layer 25 and a base substrate 26, sequentially arranged from top to bottom (i.e., along a direction facing away from the touch substrate 1 as illustrated in the figure), and a material of the package layer 21 is an insulation material. In a condition that the touch substrate 1 fails to comprise any isolation layer 90, then, with an increase in a width of routed wirings of the signal lines (i.e., the plurality of first signal lines 60 and the plurality of second signal lines 61) of the touch screen is set, a parasitic capacitance between the signal lines of the touch screen and the cathode layer of the display panel (to which the touch screen is bonded) will increase therewith, and in turn a ground capacitance of the signal lines of the touch screen may increase, and properties of both report rate and signal-to-noise ratio (SNR) of the touch screen are also decreased.

In embodiments of the disclosure, the isolation layer 90 is additionally provided on the second surface 12 of the substrate 10, and the orthogonal projection of the isolation layer 90 on the substrate 10 covers the orthogonal projections of both the plurality of first signal lines 60 and the plurality of second signal lines 61 on the substrate 10, such that the signal line of the touch screen and the cathode layer 22 are isolated from each other, thereby reducing the parasitic capacitance between the signal line of the touch screen and the cathode layer 22, and in turn reducing the ground capacitance of the signal lines of the touch screen, and improving the properties of both report rate and signal-to-noise ratio of the touch device comprising the touch substrate 1.

In exemplary embodiments, a material of the isolation layer 90 is, for example, a metal material, a transparent conductive material or the like.

In exemplary embodiments, the first electrode 31 and the second electrode 32 are arranged in one and the same layer and are arranged alternately to cross each other.

In exemplary embodiments, the first peripheral area 112 further comprises a first protection line 70 surrounding the touch area 111, the plurality of first signal lines 60 and the plurality of second signal lines 61; and the orthogonal projection of the isolation layer 90 on the substrate 10 covers an orthogonal projection of the first protection line 70 on the substrate 10.

In exemplary embodiments, the substrate 10 is provided with a plurality of through-holes 20, and first protection line 70 is connected with the isolation layer 90 by passing through the plurality of through-holes 20.

In exemplary embodiments, for example, the first peripheral area 112 further comprises a ground wire 80 surrounding the first protection line 70.

In exemplary embodiments, for example, as illustrated in FIG. 2, the touch substrate 1 also comprises a flexible printed circuit 100, and the flexible printed circuit 100 is arranged such that a portion of the orthogonal projection thereof on the touch display panel falls at least partially into the coverage of the substrate 10 of the touch substrate 1, while the other portion of the orthogonal projection thereof on the touch display panel extends beyond a side portion of the substrate; and for example, the flexible printed circuit 100 further comprises a second protection line 102 which is arranged to at least partially surround a wiring area, in which wirings are routed, on the flexible printed circuit, and to connect with the isolation layer 90 (e.g., via a lead wire between the second protection line 102 and the isolation layer 90).

In exemplary embodiments, as illustrated in FIG. 2, the isolation layer 90 comprises a second peripheral area 122 located in the second surface 12 opposite to the first peripheral area 112 located in the first surface 11, and the expression "opposite to" here means that orthogonal projections of the first peripheral area 112 and the second peripheral area 122 on the substrate 10 at least partially overlap with each other. And further, for example, the orthogonal projection of one of both the first peripheral area 112 located in the first surface 11 and the second peripheral area 122 located in the second surface 12 on the substrate 10 completely covers (or alternatively, completely coincides with) the orthogonal projection of the other one of both the first peripheral area 112 located in the first surface 11 and the second peripheral area 122 located in the second surface 12 on the substrate 10. And the isolation layer 90 comprises an isolation line arranged along the second peripheral area 122 of the second surface 12 of the substrate 10, the isolation line is provided with two terminals which are respectively grounded or connected to a synchronous signal source; and in a condition that the two terminals are respectively connected to a synchronous signal source, then the synchronous signal source and a touch self-capacitive scanning signal of the touch substrate 1 are set to be synchronous with each other and to have a same waveform.

In exemplary embodiments, more specifically, as illustrated in FIG. 2, the two terminals are further grounded or connected to the synchronous signal source respectively through an electrostatic protection device 101. In a condition that the two terminals are respectively connected to the synchronous signal source, the synchronous signal source and the touch self-capacitive scanning signal of the touch substrate 1 are set to be synchronous with each other and have the same waveform.

Further, in a condition that the two terminals are respectively connected to the synchronous signal source through the electrostatic protection device 101, a potential of the isolation layer 90 is the same as that of touch signal lines, such that there is no parasitic capacitance between the isolation layer 90 and the touch signal lines.

In exemplary embodiments, the electrostatic protection device 101 is, for example, a transient suppression diode (TVS) or an electrostatic protection diode.

In exemplary embodiments, more specifically, the isolation line of the isolation layer 90 comprises two isolation sub-lines which are mutually disconnected from each other and define cooperatively the second peripheral area 122 of the second surface 12 of the substrate 10 abutting tightly against the isolation layer 90, and each isolation sub-line is grounded or connected to a synchronous signal source, and the synchronous signal source and a touch self-capacitive scanning signal of the touch substrate are set to be synchronized with each other and have a same waveform Specifically, in a condition that the isolation layer 90 comprises two isolation sub-lines which are mutually disconnected from each other, that is, the isolation line of the isolation layer 90 comprise two isolation sub-lines which are mutually disconnected from each other, each isolation sub-line has a respective one of the aforementioned terminals, and the two isolation sub-lines jointly/cooperatively define the second peripheral area 122 of the second surface 12 of the substrate 10 abutting tightly against the isolation layer 90, then, when static electricity on the touch substrate 1 is discharged through the isolation layer 90, the static electricity may only be discharged in a direction close to (i.e., proximal to) the terminals, for example, the static electricity at point B in FIG. 2 will only be discharged in a clockwise direction. In a condition that the isolation layer merely comprises an integral isolation line formed along the second peripheral area 122 of the second surface of the substrate, then, when the static electricity at the point B on the touch substrate 1 is being discharged, it is possible that the static electricity at the point B may be discharged to the terminals in two directions (i.e., both clockwise direction and counterclockwise direction). For the point B, if the static electricity is discharged in the counterclockwise direction, then, a path of the static electricity passing through the touch substrate 1 is longer than that of the static electricity passing through the touch substrate 1 in the clockwise direction, then, the static electricity may break down the touch substrate 1 during the discharging process in the counterclockwise direction, resulting in an enhanced risk of injury to the touch substrate 1 due to breakdown thereof.

In exemplary embodiments, the two isolation sub-lines are respectively grounded or connected to the synchronous signal source through the electrostatic protection device 101, and the synchronous signal source and the touch self-capacitive scanning signal of the touch substrate 1 are set to be synchronous with each other and have the same waveform.

OTHER EMBODIMENTS

Based on the inventive concept of the above embodiments of the disclosure, a touch device is further provided in embodiments of the disclosure, comprising a touch substrate prepared by the above embodiments. The touch device may be any products or components having display functionality, such as mobile phone, tablet computer, television, monitor, laptop computer, digital photo frame, navigator and the like.

Further Embodiments

Figure 4:
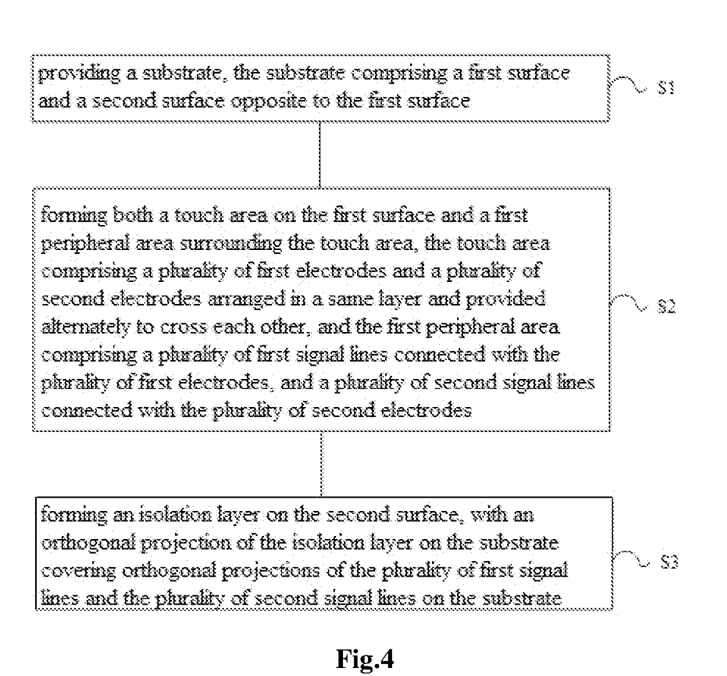
FIG. 4 is a schematic flow chart of a method for preparing an exemplary touch substrate according to a second embodiment of the disclosure.

Based on the inventive concept of the aforementioned embodiments of the disclosure, a method for preparing a touch substrate is also provided in embodiments of the disclosure, which is intended to improve relatively low report rate and relatively signal-to-noise ratio caused by relatively large ground capacitance of the signal lines of the touch screen in relevant art. FIG. 4 is a schematic flow chart of a method for preparing an exemplary touch substrate according to a second embodiment of the disclosure. As illustrated in FIG. 4, the method for preparing the touch substrate comprises:

S1: providing a substrate, the substrate comprising a first surface and a second surface opposite to the first surface;

S2: forming both a touch area on the first surface and a first peripheral area surrounding the touch area, the touch area comprising a plurality of first electrodes and a plurality of second electrodes arranged in a same layer and provided alternately to cross each other, and the first peripheral area comprising a plurality of first signal lines connected with the plurality of first electrodes, and a plurality of second signal lines connected with the plurality of second electrodes; and S3: forming an isolation layer on the second surface, with an orthogonal projection of the isolation layer on the substrate covering orthogonal projections of the plurality of first signal lines and the plurality of second signal lines on the substrate.

The method for preparing the touch substrate is provided in the embodiments of the disclosure; by forming on the second surface of the substrate the isolation layer whose orthogonal projection on the substrate covers orthogonal projections of the plurality of first signal lines and the plurality of second signal lines on the substrate, the parasitic capacitance between the signal lines (i.e., the plurality of first signal lines and the plurality of second signal lines) of the touch screen and the cathode layer 22 is reduced, and the ground capacitance of the signal lines of the touch screen is in turn reduced, and the properties of both report rate and signal-to-noise ratio of the touch device comprising the touch substrate are improved.

Technical solutions of the embodiments of the disclosure will be described in detail through specific embodiments hereinafter.

FIGS. 5-8 are schematic views of a preparation of a touch module or assembly according to the third embodiment of the disclosure. Among others, a "patterning process" in the embodiments of the disclosure comprises processing steps such as: depositing a film layer, coating a photoresist, exposing with a mask, development, etching, stripping of the photoresist, and the like, which are mature preparation processes in the relevant art; and deposition may for example adopt a known process, such as sputtering, evaporation, chemical vapor deposition or the like; and coating may for example adopt a known coating process; and etching may also for example adopt a known etching method, specific processes of above are not specified herein.

Figure 5:
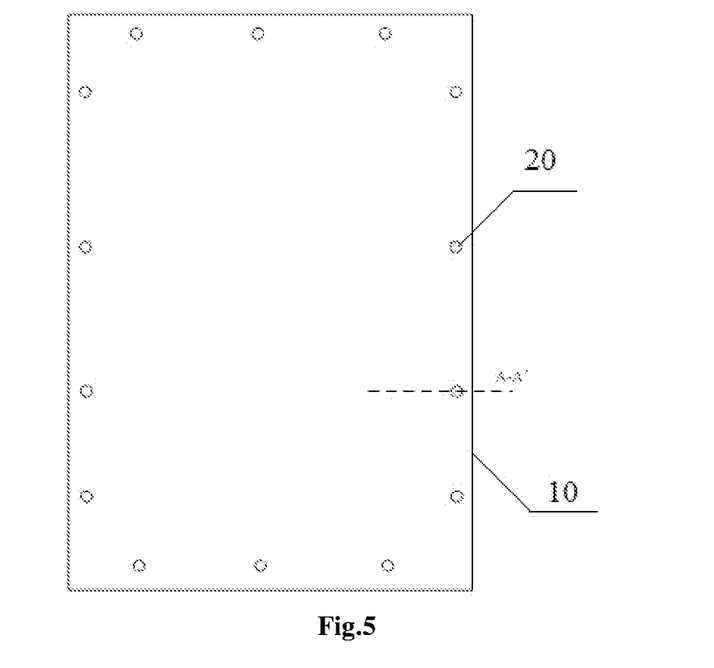
FIG. 5 is a schematic diagram of a through-hole formed in a third embodiment of the disclosure.
Figure 6:
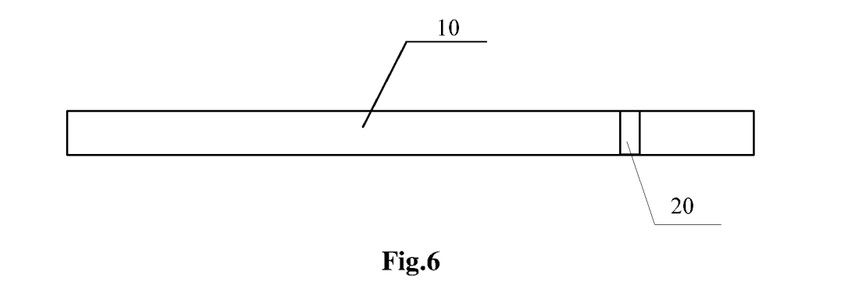
FIG. 6 is a sectional view of a section A-A' as illustrated in FIG. 5.

The method for preparing a touch substrate according to the embodiments of the disclosure comprises:

S11: as illustrated in FIG. 5 and FIG. 6, preparing a substrate 10, and then, forming a plurality of through-holes 20 on the substrate 10;

In exemplary embodiments, the substrate 10 is, for example, a rigid substrate or a flexible substrate, the rigid substrate may for example be one or more of glass or metal foil (but not limited thereto), and the flexible substrate may for example be one or more of following materials, such as (but not limited thereto): polyethylene terephthalate, ethylene terephthalate, polyether-ether-ketone (PEEK), polystyrene, polycarbonate, polyarylate, polyarylester, polyimide, polyvinyl chloride, polyethylene, textile fiber.

In exemplary embodiments, in order to improve bending performance of the display product and make the display product more suitable for realizing a flexible touch function, the substrate 10 in the embodiments of the application is for example a flexible substrate.

In exemplary embodiments, a metal material is filled in the plurality of through-holes 20 to electrically connect the first protection line 70 with the isolation layer 90, in the exemplary embodiment, a metal material is filled in the plurality of through-holes 20, for example, through an electroplating process, and the metal material in the plurality of through-holes 20 may for example be a metal material selected as any one of metal aluminum (Al), metal copper (Cu), or an alloy thereof. In exemplary embodiments, the metal material in the plurality of through-holes 20 is formed at the same time as, for example, an isolation layer or a first protection line.

Figure 7:
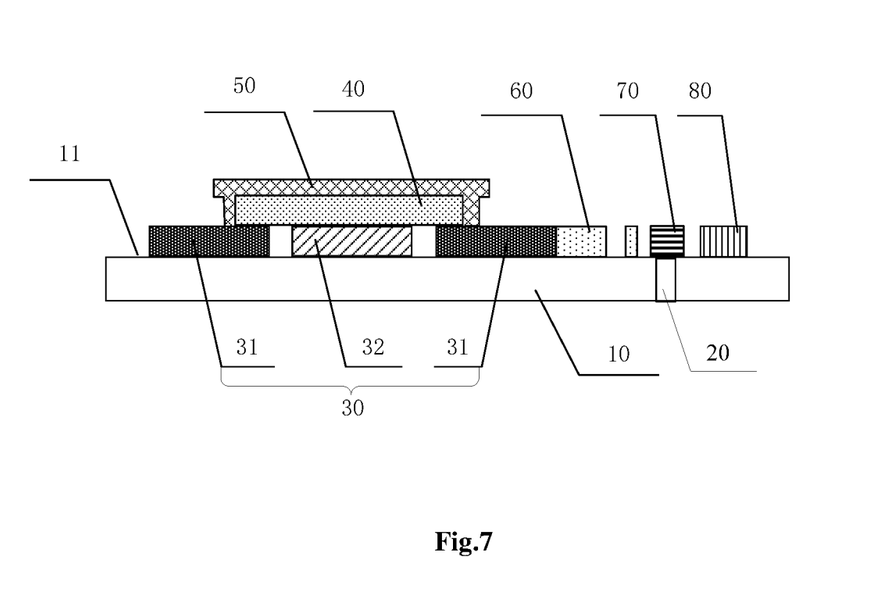
FIG. 7 is a sectional view of a section A-A' after both a touch area and a first peripheral area surrounding the touch area are formed on the first surface of the substrate in the third embodiment of the disclosure.

S12: as illustrated in FIG. 7 and FIG. 1, a touch area 111 and a first peripheral area 112 surrounding the touch area are formed on a first surface 11 of the substrate 10, the touch area 111 comprises a plurality of first electrodes 31 and a plurality of second electrodes 32, the first peripheral area 112 comprises a first signal line 60 connected with the first electrode 31 and a second signal line 61 connected with the second electrode 32; and the first peripheral area 112 further comprises a first protection line 70 surrounding the touch area 111, the plurality of first signal lines 60 and the plurality of second signal lines 61, and a ground wire 80 surrounding the first protection line 70.

In exemplary embodiments, the touch area 111 comprises a touch electrode layer 30, an insulation layer 40 and a bridging layer 50.

The touch electrode layer 30 comprises a plurality of first electrodes 31 and a plurality of second electrodes 32 which are arranged alternately to cross each other and electrically insulated from each other, the plurality of first electrodes 31 may be formed as an integral structure, and the plurality of second electrodes 32 are a plurality of second electrode blocks mutually disconnected, with adjacent second electrode blocks being connected via the bridging layer 50; or, the plurality of second electrodes 32 may be formed as an integral structure, and the plurality of first electrode 31 are a plurality of first electrode blocks mutually disconnected, with adjacent first electrode blocks being connected via the bridging layer 50.

Specifically, the first peripheral area 112 may be formed at the same time when the touch electrode layer 30 is formed in the touch area 111; or the first peripheral area 112 may be formed at the same time when the bridge layer 50 is formed in the touch area 111; certainly, or alternatively otherwise, for example, the first peripheral area 112 is formed independently, rather than being formed at the same time with other structures on the touch substrate 1.

In some embodiments, a material or materials forming the plurality of first electrodes 31 and the second electrodes 32 may for example be a metal material or a transparent conductive material, the metal material may for example be metal molybdenum (Mo), metal copper (Cu), metal aluminum (Al), or an alloy thereof, and the transparent conductive material may for example be indium tin oxide (ITO) or indium zinc oxide (IZO). In a condition that the material forming the plurality of first electrodes 31 and the plurality of second electrodes 32 is a metal material, the touch screen is an integrated touch screen in the form of an One-Glass-Metal-Mesh (OGM) type structure; and in a condition that the material forming the plurality of first electrodes 31 and the plurality of second electrodes 32 is a transparent conductive material, the touch screen is an integrated touch screen in the form of an One-Glass-Solution (OGS) type structure.

In exemplary embodiments, the material forming the plurality of first electrodes 31 and the plurality of second electrodes 32 may for example be ITO, which may increase a light transmissivity of the touch substrate 1; and since the reflectivity of ITO is smaller as compared with that of a metal element, then a visual effect of an observer by the light reflected thereby may be reduced.

In exemplary embodiments, S12 specifically comprises the following steps:

An ITO material layer is obtained by depositing a layer of ITO on the first surface 11 of the substrate 10, and then an electrode pattern of the touch electrode layer 30 is obtained by processing the ITO material layer with an one-time patterning process; and the electrode pattern of the touch electrode layer 30 comprises the plurality of first electrodes 31 and the plurality of second electrodes 32 that are arranged alternately to cross each other, and spaced apart from each other. For example, each type of the plurality of first electrodes 31 and the plurality of second electrodes 32 comprises a plurality of diamond block electrodes (i.e., a plurality of electrodes each in the form of diamond block shape) arranged in an array as illustrated in the drawings. More specifically, in one type of the plurality of first electrodes 31 and the plurality of second electrodes 32, diamond block electrodes in each row thereof are connected with one another, but various rows thereof are disconnected from one another; while in another type of the plurality of first electrodes 31 and the plurality of second electrodes 32, individual diamond block electrodes thereof are spaced apart from one another; for example, as illustrated in FIG. 1, as to the plurality of first electrodes 31, first electrodes, each of which is in the form of diamond block shape, in each row thereof are connected with one another, but various rows thereof are disconnected from one another; while as to the plurality of second electrodes 32, second electrodes, each of which is in the form of diamond block shape, are individually spaced apart from one another.

A pattern of the insulation layer is formed on the first surface 11 of the substrate 10 which has been formed with the pattern of the touch electrode layer.

Patterns of the bridging layer 50 and the first peripheral area 112 are formed on the first surface 11 of the substrate 10 which has been formed with the pattern of the touch electrode layer. The bridging layer 50 is arranged to connect and bridge various diamond block electrodes in each line (e.g., each column or each row) of the type of electrodes in which individual diamond block electrodes thereof are spaced apart from one another.

In exemplary embodiments, for example, a layer of ITO is deposited on the first surface 11 of the substrate 10 by coating, magnetron sputtering, thermal evaporation or plasma enhanced chemical vapor deposition (PECVD), so as to obtain the ITO material layer; and then the ITO material layer is processed with an one-time patterning process so as to obtain the touch electrode layer.

Among others, the one-time patterning process comprises photoresist coating, exposure, development and photoresist stripping. Therefore, obtaining the touch electrode layer by processing the ITO material layer with an one-time patterning process, comprising: coating a layer of photoresist on the first surface 11 of the substrate 10 to obtain the photoresist layer; using a mask to expose the photoresist layer, such that the photoresist layer forms a fully exposed area and a unexposed area; then, the photoresist in the fully exposed area is completely removed and the photoresist in the unexposed area is completely reserved through a development process; a respective area on the substrate corresponding to the fully exposed area is etched by an etching process; and finally the photoresist in the unexposed area is stripped. The ITO structure reserved on the substrate is the pattern of the touch electrode layer. Here "corresponding to" means that, the respective area and an orthogonal projection of the fully exposed area on the substrate at least partially overlap with each other.

In exemplary embodiments, forming the pattern of the insulation layer comprises: coating a layer of insulation layer film on the first surface 11 of the substrate 10 on which the pattern of the touch electrode layer is formed, exposing and developing the insulation layer film with a mask, and forming the pattern of the insulation layer on the touch electrode layer 30. The insulation layer film is for example formed by a material such as organic resin and the like.

In exemplary embodiments, in the first peripheral area 112, there are formed with: the plurality of first signal lines 60 connected with the plurality of first electrodes 31; the plurality of second signal lines 61 connected with the plurality of second electrode 32; and the first protection line 70 surrounding the touch area 111, the plurality of first signal lines 31 and the plurality of second signal lines 32; and the ground wire 80 surrounding the first protection line 70, and the like.

A material forming the bridging layer 50 and the first peripheral area 112 may for example be a metal material, specifically e.g., a metal material comprising metal molybdenum (Mo) or the like. In exemplary embodiments, for example, by using a method such as coating, magnetron sputtering, thermal evaporation, or PECVD, or the like, a layer of metal is deposited on the first surface 11 of the substrate 10 on which the insulation layer is formed, so as to obtain a first metal material layer; and then, the first metal material layer is processed by the one-time patterning process so as to obtain the bridging layer and the first peripheral area 112. A process of processing the first metal material layer by the one-time patterning process may refer to a process of processing the ITO material layer by a one-time patterning process, and will not be repeated herein in embodiments of the disclosure. In embodiments of the disclosure, the bridging layer 50 and the first peripheral area 112 may be manufactured in one and the same layer, and for example, a specific manufacturing process thereof may be completed once by a one-time patterning process, facilitating saving production time without increasing any production cost.

Figure 8:
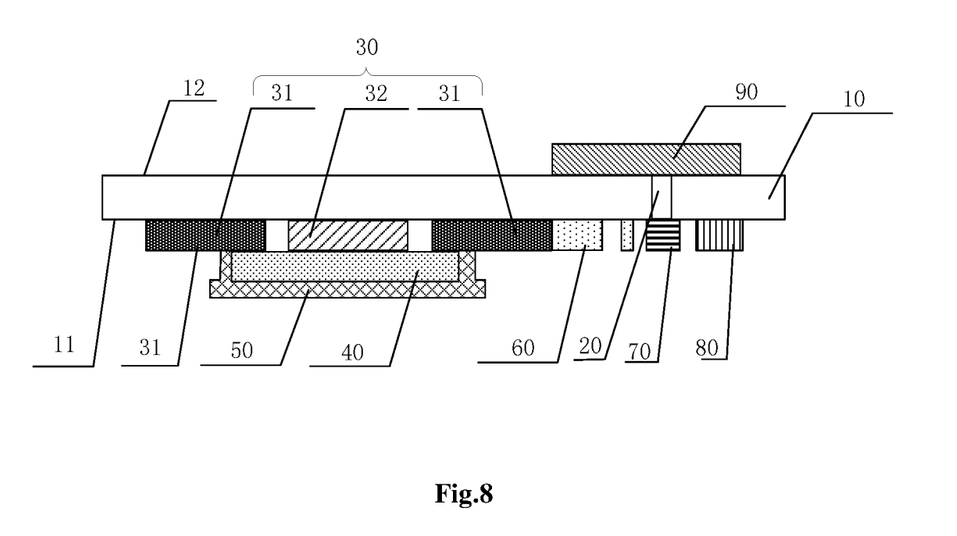
FIG. 8 is a sectional view of a section A-A' after an isolation layer is formed on the second surface of the substrate in the third embodiment of the disclosure.

S13. as illustrated in FIG. 8 and FIG. 2, an isolation layer 90 is formed along the second peripheral area 122 of the second surface 12 of the substrate 10, an orthogonal projection of the isolation layer 90 on the substrate 10 covers orthogonal projections of the plurality of first signal lines and the plurality of second signal lines on the substrate, and the isolation layer 90 is electrically connected with the first protection line 70 through the plurality of through-holes 20.

In exemplary embodiments, a material of the isolation layer 90 is, for example, a metal or a transparent conductive material or the like.

In exemplary embodiments, for example, a layer of metal is deposited on the second surface of the substrate by means of coating, magnetron sputtering, thermal evaporation, PECVD or the like, so as to obtain a second metal material layer, and then the second metal material layer is processed by a one-time patterning process so as to obtain the isolation layer 90. The process of processing the second metal material layer through the one-time patterning process may refer to a process of processing the ITO material layer with a one-time patterning process, and will not be repeated herein in embodiments of the disclosure.

It should be noted that, a sequence of S12 and S13 may be adjusted as per practical requirements in production, for example.

Obviously, many changes may also be made in specific implementations of various embodiments as above, by way of example, a specific routing way of the wirings/lines on the first surface of the substrate may be adjusted as per practical requirements; and specific size of the plurality of through-holes may for example be changed as per practical requirements on products. And the isolation layer 90 is also for example provided by a process such as printing or the like.

In exemplary embodiments, the isolation layer 90 comprises an isolation line arranged along the second peripheral area 122 of the second surface 12 of the substrate 10, and the isolation line is provided with two terminals, which are respectively grounded or connected to a synchronous signal source. The synchronous signal source and a touch self-capacitive scanning signal of the touch substrate 1 are set to be synchronous with each other and to have a same waveform.

In exemplary embodiments, the two terminals are respectively grounded or connected to the synchronous signal source via an electrostatic protection device 101. The synchronous signal source and the touch self-capacitive scanning signal of the touch substrate 1 are set to be synchronous with each other and have the same waveform.

Specifically, the electrostatic protection device 101 is, for example, a transient suppression diode (TVS) or an electrostatic protection diode.

In exemplary embodiments, the isolation layer 90 comprises two isolation sub-lines which are mutually disconnected from each other, that is, the isolation line of the isolation layer 90 comprises two isolation sub-lines which are mutually disconnected from each other, then, each isolation sub-line is provided with one of the two terminals as above, and the two isolation sub-lines jointly/cooperatively define the second peripheral area 122 of the second surface 12 of the substrate 10 abutting tightly against the isolation layer 90, and each isolation sub-line is grounded or connected to the synchronous signal source; or each isolation sub-line is above all connected to the electrostatic protection device 101 and then grounded or connected to the synchronous signal source, the synchronous signal source and the touch self-capacitive scanning signal of the touch substrate 1 are set to be synchronous with each other and have the same waveform.

Specifically, in a condition that the isolation layer 90 comprises two isolation sub-lines which are mutually disconnected from each other, then, when static electricity on the touch substrate 1 is discharged through the isolation layer 90, the static electricity may only be discharged in a direction close to (i.e., proximal to) the terminals, for example, the static electricity at point B in FIG. 2 will only be discharged in a clockwise direction. In a condition that the isolation layer merely comprises an integral isolation line formed along the second peripheral area 122 of the second surface of the substrate, then, when the static electricity at the point B on the touch substrate 1 is being discharged, it is possible that the static electricity at the point B may be discharged to the terminals in two directions (i.e., both clockwise direction and counterclockwise direction). For the point B, if the static electricity is discharged in the counterclockwise direction, then, a path of the static electricity passing through the touch substrate 1 is longer than that of the static electricity passing through the touch substrate 1 in the clockwise direction, then, the static electricity may break down the touch substrate 1 during the discharging process in the counterclockwise direction, resulting in an enhanced risk of injury to the touch substrate 1 due to breakdown thereof.

In exemplary embodiments, specific width of the isolation line or each isolation sub-line is set equal to a width of each signal line extending between a connection position at which a respective one of the plurality of first signal lines and a respective one of the plurality of first electrodes and an edge position, in the first peripheral area 112. Such a setting may facilitate further decreasing the parasitic capacitance generated between the signal lines in the first peripheral area 112 and the cathode layer of the display panel.

FURTHER EMBODIMENTS

Figure 9:
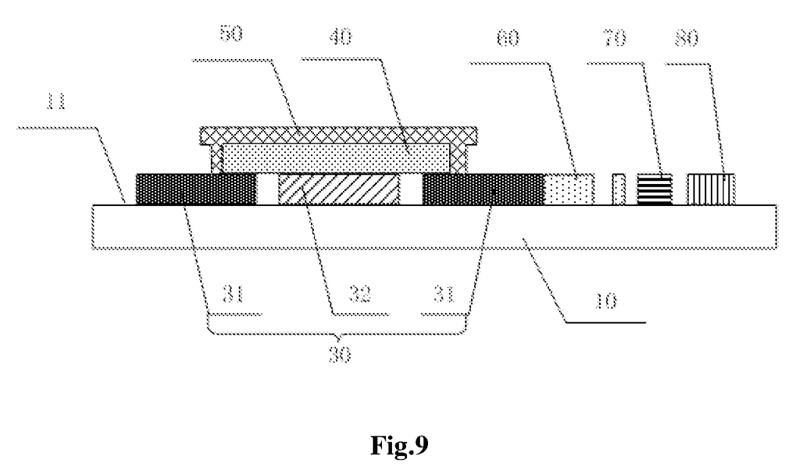
FIG. 9 is a sectional view of a section A-A' after both a touch area and a first peripheral area surrounding the touch area are formed on the first surface of the substrate in the fourth embodiment of the disclosure.

FIGS. 9-12 are schematic views of a preparation of a touch module according to fourth embodiment of the disclosure. The method for preparing the touch substrate according to embodiments of the disclosure comprises:

S21: as illustrated in FIG. 9 and FIG. 1, the touch area 111 and the first peripheral area 112 surrounding the touch area 111 are formed on the first surface 11 of the substrate 10. The touch area 111 comprises an electrode pattern of the plurality of first electrode 31 and the plurality of second electrode 32 which are arranged in the same layer and cross each other; the first peripheral area comprises the plurality of first signal lines 60 connected with the plurality of first electrodes 31, the plurality of second signal lines 61 connected with the plurality of second electrode 32; and the first peripheral region 112 further comprises a binding area to which the flexible printed circuit (FPC) 100 is bound. Among others, the electrode pattern comprises the plurality of first electrodes 31 and the plurality of second electrodes 32 arranged alternately to cross each other, and spaced apart from each other. For example, each type of the plurality of first electrodes 31 and the plurality of second electrodes 32 comprises a plurality of diamond block electrodes (i.e., a plurality of electrodes each in the form of diamond block shape) arranged in an array as illustrated in the drawings. More specifically, in one type of the plurality of first electrodes 31 and the plurality of second electrodes 32, diamond block electrodes in each row thereof are connected with one another, but various rows thereof are disconnected from one another; while in another type of the plurality of first electrodes 31 and the plurality of second electrodes 32, individual diamond block electrodes thereof are spaced apart from one another; for example, as illustrated in FIG. 1, as to the plurality of first electrodes 31, first electrodes, each of which is in the form of diamond block shape, in each row thereof are connected with one another, but various rows thereof are disconnected from one another; while as to the plurality of second electrodes 32, second electrodes, each of which is in the form of diamond block shape, are individually spaced apart from one another.

The process of forming the touch area 111 and the first peripheral area 112 in the embodiment is substantially the same as that of forming the touch area 111 and the first peripheral area 112 in the previous first embodiment. Above all, the pattern of the touch electrode layer pattern is formed on the substrate, then the pattern of the insulation layer is formed on the touch electrode layer, and next the pattern of the bridging layer is formed on the insulation layer, as illustrated in FIG. 1 and FIG. 9. Among others, the bridging layer is arranged to connect and bridge various diamond block electrodes in each line (e.g., each column or each row) of the type of electrodes in which individual diamond block electrodes thereof are spaced apart from one another.

The first peripheral area 112 in the embodiments further comprises the plurality of first signal lines 60 connected with the plurality of first electrodes 31, the plurality of second signal lines 61 connected with the plurality of second electrodes 32, and the binding area to which the flexible printed circuit 100 is bound, and the like. Of course, the first peripheral area 112 in the present embodiment also comprises: for example, the first protection line 70 surrounding the touch area 111, the plurality of first signal lines 31 and the plurality of second signal lines 32; and the ground wire 80 surrounding the protection line 70, etc. according to the embodiments.

Figure 10:
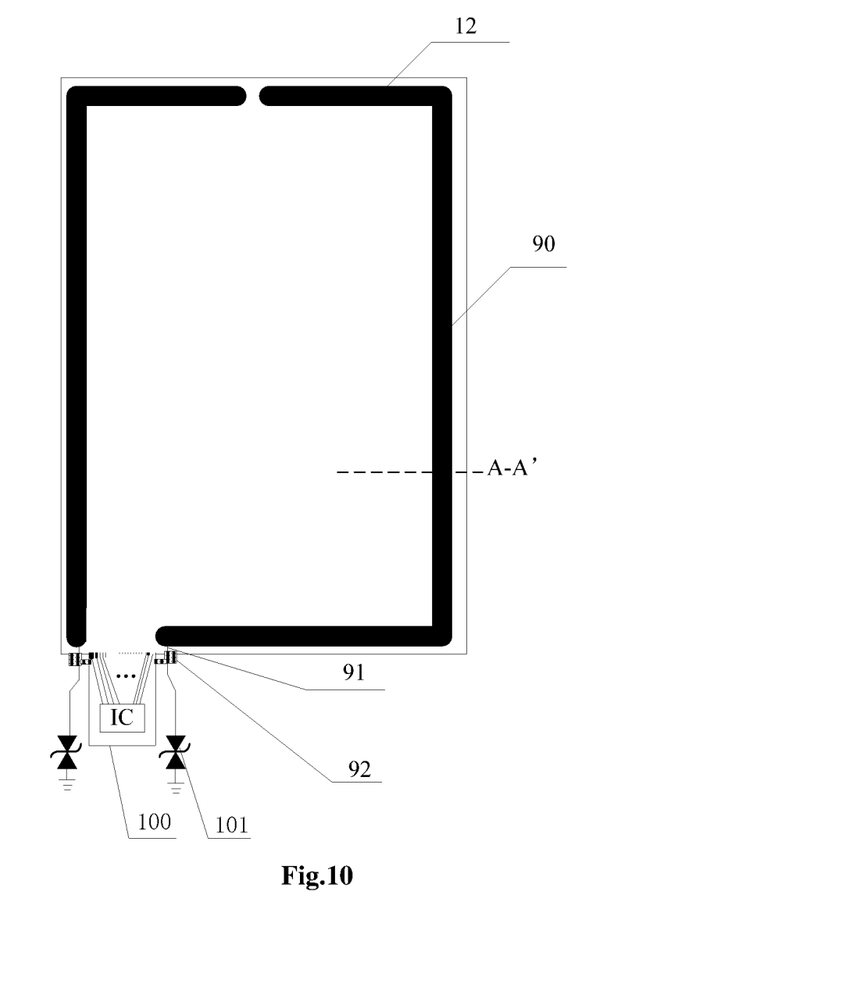
FIG. 10 is a schematic diagram of the fourth embodiment of the present disclosure, after an isolation layer, a lead wire and a lead wire pad are formed along a second peripheral area of the second surface of the substrate.
Figure 11:
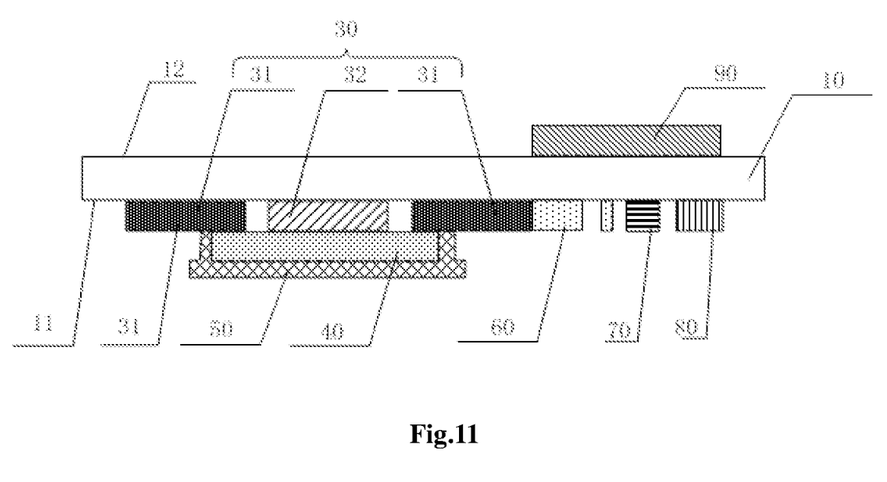
FIG. 11 is a sectional view of a section A-A' as illustrated in FIG. 10.

S22: as illustrated in FIGS. 10 and 11, the isolation layer 90, a lead wire 91 and a lead wire pad 92 are formed along the second peripheral area 122 of the second surface 12 of the substrate 10, and the orthogonal projection of the isolation layer 90 on the substrate 10 covers orthogonal projections of the plurality of first signal lines 31 and the plurality of second signal lines 32 on the substrate 10.

Forming the isolation layer 90, the lead wire 91 and the lead wire pad 92 along the second peripheral area 122 of the second surface 12 of the substrate 10 comprises: depositing a metal film on the second surface 12 of the substrate 10 so as to obtain a second metal material layer; coating a layer of photoresist on the metal film; exposing and developing the photoresist with a mask; forming an unexposed area in which the photoresist is reserved at positions of patterns of the isolation layer 90, the lead wire 91 and the lead wire pad 92 to be formed, and forming a fully exposed area in which the photoresist is removed at other positions; and etching the metal film in the fully exposed area and stripping remaining photoresist, so as to form the patterns of the isolation layer 90, the lead wire 91 and the lead wire pad 92, as illustrated in FIG. 8. Among others, the patterns of the isolation layer 90, the lead wire 91 and the lead wire pad 92 are all formed in the second peripheral area 122 of the second surface 12 of the substrate 10, and the second peripheral area 122 of the second surface 12 is opposite to the first peripheral area 112 of the first surface 11. Here "opposite to" means that respective orthogonal projections of first peripheral area 112 and the second peripheral area 122 on the substrate may at least partially overlap with each other. And further, for example, the orthogonal projection of one of both the first peripheral area 112 located in the first surface 11 and the second peripheral area 122 located in the second surface 12 on the substrate 10 completely covers (or alternatively, completely coincides with) the orthogonal projection of the other one of both the first peripheral area 112 located in the first surface 11 and the second peripheral area 122 located in the second surface 12 on the substrate 10. In the embodiments, the lead wire 91 and the lead wire pad 92 are provided at a lower side of the second peripheral area 122 of the second surface 12 of the substrate 10, and the lead wire pad 92 is connected with the lead wire 91. For example, the metal film is formed by a metal material having a relatively low resistance and thus has a relative fine conductive effect, facilitating improving a touch sensitivity of a touch screen.

It should be noted that, the isolation layer 90 is also provided by a process such as printing and the like.

Figure 12:
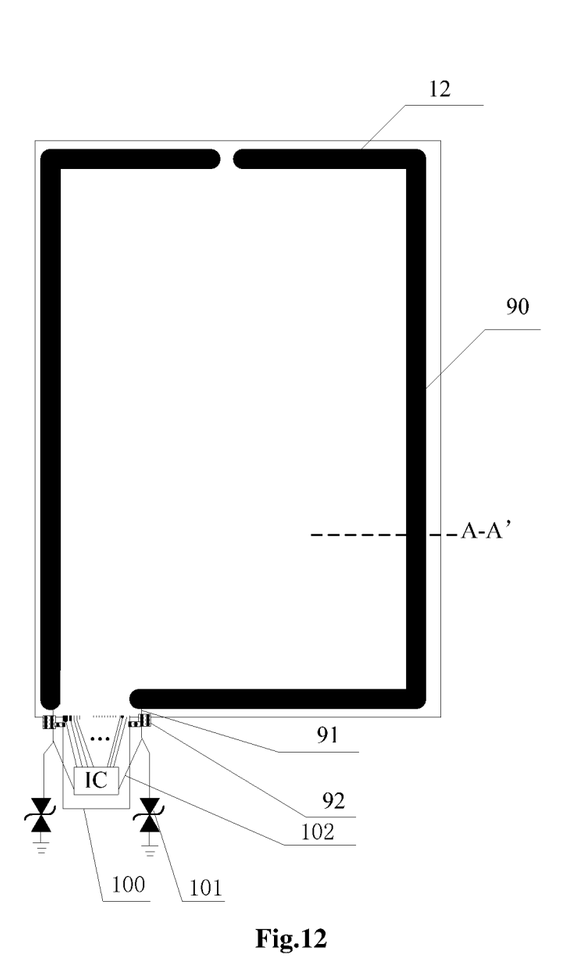
FIG. 12 is a schematic diagram of the fourth embodiment of the disclosure, after a second protection line in a flexible printed circuit is electrically connected with the isolation layer through a lead.

S23: binding the flexible printed circuit 100, as illustrated in FIG. 12. The flexible printed circuit 100 comprises a second protection line 102, which is electrically connected with the isolation layer 90 through the lead wire 91.

The method for preparing a touch substrate according to the embodiment has the same technical effect as that of the third embodiment, and effectively improving the effect of a relatively large ground capacitance of the signal lines of the touch screen of the touch substrate in relevant art. In embodiments of the disclosure, the isolation layer 90 is electrically connected with the second protection line 102 in the flexible printed circuit by binding on a back surface of the flexible printed circuit.

As compared with relevant art, on the basis of above technical solutions, the touch substrate and the method for preparing the same, as well as the touch device according to embodiments of the disclosure at least have beneficial effects as follows:

In comparison with relevant art, in the touch substrate and the method for preparing the same, as well as the touch device according to the embodiment of the disclosure, by providing the isolation layer on the second surface of the substrate, with the orthogonal projection of the isolation layer one the substrate covering the orthogonal projections of both the plurality of first signal lines and the plurality of second signal lines on the substrate, then, the parasitic capacitance between the signal lines (i.e., the plurality of first signal lines and the plurality of second signal lines) of the touch screen and the cathode layer of the display panel is reduced, and the ground capacitance of the signal lines of the touch screen is in turn reduced, and the properties of both report rate and signal-to-noise ratio of the touch device comprising the touch substrate are improved.

In the description of embodiments of the disclosure, it should be understood that, terms "middle/intermediate", "on/above", "under/below", "front", "back", "vertical", "horizontal", "top", "bottom", "inside", "outside" and the like, indicate respective orientational or positional relationship which is based on the orientational or positional relationship as illustrated in the drawings, merely intending to facilitate describing the disclosure and simplifying the depiction, rather than indicating or implying that the devices or elements as referred to have to be oriented in a specific orientation/direction, to be constructed and to operate in a specific orientation, thus the terms may not be understood as a limitation of the disclosure.

In the description of embodiments of the disclosure, it should be noted that unless otherwise specified and defined, the terms "installation" and "connection" should be understood in a broader sense; for example, it may be a fixed connection, or alternatively a detachable connection, or otherwise an integrated connection; it may also be a mechanical connection, or an electrical connection; it may further be a direct connection, or an indirect connection via an intermediate medium, or may be an internal connection inside two components. For those of ordinary skill in the art, the specific meaning of the above terms in embodiments of the disclosure may be understood in specific conditions.

Although the disclosed embodiment of the disclosure is as above, the content is merely intended for facilitating understanding the embodiments of the disclosure, rather than being used to define the embodiments of the disclosure. Any person skilled in the art of the disclosure may make any modification and change in the form and details of the implementation without departing from the spirit and scope disclosed in the disclosure, and the scope of patent protection of the disclosure shall still be subject to the scope defined in the appended claims.

What is claimed is:

1. A touch substrate, comprising a substrate, the substrate having a touch area on a first surface thereof and a first peripheral area surrounding the touch area, the touch area comprising a plurality of first electrodes and a plurality of second electrodes arranged in a same layer and provided alternately to cross each other, and the first peripheral area comprising a plurality of first signal lines connected with the plurality of first electrodes, and a plurality of second signal lines connected with the plurality of second electrodes; and
   the touch substrate further comprises an isolation layer provided on a second surface of the substrate, with an orthogonal projection of the isolation layer on the substrate covering orthogonal projections of the plurality of first signal lines and the plurality of second signal lines on the substrate, and the second surface being opposite to the first surface.

2. The touch substrate according to claim 1, wherein the first peripheral area further comprises a first protection line surrounding the plurality of first signal lines and the plurality of second signal lines; and
   the orthogonal projection of the isolation layer on the substrate covers an orthogonal projection of the first protection line on the substrate.

3. The touch substrate according to claim 2, wherein the substrate is provided with a plurality of through-holes, and the first protection line is connected with the isolation layer by passing through the plurality of through-holes.

4. The touch substrate according to claim 1, wherein the touch substrate also comprises a flexible printed circuit, the flexible printed circuit comprises a second protection line arranged to at least partially surround a wiring area, in which wirings are routed, on the flexible printed circuit, and to connect with the isolation layer.

5. The touch substrate according to claim 1, wherein the isolation layer comprises an isolation line arranged along the second surface of the substrate, the isolation line is provided with two terminals which are respectively grounded or connected to a synchronous signal source, and the synchronous signal source and a touch self-capacitive scanning signal of the touch substrate are set to be synchronous with each other and to have a same waveform.

6. The touch substrate according to claim 1, wherein the isolation layer comprises two isolation sub-lines mutually disconnected from each other, each of which is grounded or connected to a synchronous signal source, and the synchronous signal source and a touch self-capacitive scanning signal of the touch substrate are set to be synchronized with each other and have a same waveform.

7. The touch control base plate according to claim 6, wherein each isolation sub-line is grounded or connected to the synchronous signal source through an electrostatic protection device.

8. The touch substrate according to claim 7, wherein the electrostatic protection device is a transient suppression diode or an electrostatic protection diode.

9. The touch substrate according to claim 1, wherein the isolation layer is formed by a metal or a transparent conductive material.

10. A touch device, including the touch substrate according to claim 1.

11. A method for preparing a touch substrate, comprising:
providing a substrate, the substrate comprising a first surface and a second surface opposite to the first surface;
forming both a touch area on the first surface and a first peripheral area surrounding the touch area, the touch area comprising a plurality of first electrodes and a plurality of second electrodes arranged in a same layer and provided alternately to cross each other, and the first peripheral area comprising a plurality of first signal lines connected with the plurality of first electrodes, and a plurality of second signal lines connected with the plurality of second electrodes; and
forming an isolation layer on the second surface, with an orthogonal projection of the isolation layer on the substrate covering orthogonal projections of the plurality of first signal lines and the plurality of second signal lines on the substrate.

12. The preparation method according to claim 11, wherein forming both a touch area on the first surface and a first peripheral area surrounding the touch area comprises:
forming a plurality of through-holes passing through the substrate;
forming a touch area on the first surface of the substrate through which a plurality of through-holes are formed, and a first peripheral area surrounding the touch area, to establish a connection between the first protection line and the isolation layer via the plurality of through-holes.

13. The preparation method according to claim 12, wherein the method further comprises:
filling the plurality of through-holes with metal material by an electroplating process, to establish an electrical connection between the isolation layer and the first protection line.

14. The preparation method according to claim 11, wherein the method further comprises: forming a flexible printed circuit comprising a second protection line arranged to at least partially surround a wiring area, in which wirings are routed, on the flexible printed circuit, and to connect with the isolation layer.

15. The preparation method according to claim 11, wherein forming an isolation layer on the second surface comprises:
forming an isolation layer on the second surface of the substrate by a printing process or a patterning process.

* * * * *